United States Patent
Yamamoto

[19]

[11] Patent Number: 6,051,842

[45] Date of Patent: Apr. 18, 2000

[54] ILLUMINATION OPTICAL APPARATUS WITH OPTICAL INTEGRATOR

[75] Inventor: Noriaki Yamamoto, Kawasaki, Japan

[73] Assignee: Nikon Corporation, Tokyo, Japan

[21] Appl. No.: 09/004,980

[22] Filed: Jan. 9, 1998

[30] Foreign Application Priority Data

Jan. 9, 1997 [JP] Japan ................................. 9-013301

[51] Int. Cl.[7] ........................................... G01J 1/32
[52] U.S. Cl. .................. 250/548; 250/229; 250/214 PR; 355/53
[58] Field of Search ............................. 250/548, 214 PR, 250/229, 205, 201.2; 356/399–401; 355/53, 67, 68, 70, 71

[56] References Cited

U.S. PATENT DOCUMENTS

| | | | |
|---|---|---|---|
| 4,689,078 | 8/1987 | Koike et al. ........................ | 106/31.33 |
| 5,579,147 | 11/1996 | Mori et al. ............................ | 359/204 |
| 5,581,075 | 12/1996 | Naraki et al. ........................ | 250/205 |
| 5,661,837 | 8/1997 | Yamamota et al.. ................. | 385/115 |
| 5,777,724 | 7/1998 | Suzuki .................................. | 355/68 |
| 5,892,573 | 4/1999 | Takahashi et al. .................. | 355/53 |

FOREIGN PATENT DOCUMENTS 7-153683   6/1996   Japan .

*Primary Examiner*—Stephone Allen
*Attorney, Agent, or Firm*—Morgan, Lewis & Bockius LLP

[57] ABSTRACT

An illumination optical apparatus includes a light source emitting an illumination light beam, the illumination light beam being directed along a predetermined optical path, a variable optical filter disposed on the predetermined optical path of the illumination light beam for controlling the intensity of the illumination light beam, a transmissivity of the variable optical filter with respect to the illumination light beam being continuously variable, and an optical integrator receiving the illumination light beam that has passed through the variable optical filter to form a plurality of images of the light source.

23 Claims, 7 Drawing Sheets

ILLUMINATION OPTICAL APPARATUS WITH OPTICAL INTEGRATOR

This application claims the benefit of Japanese Application No. 09-013301, filed in Japan on Jan. 9, 1997, which is hereby incorporated by reference.

BACKGROUND OF THE INVENTION

1. Field of the Invention

The present invention relates to an illumination optical apparatus equipped with an optical integrator, and more particularly, to an illumination optical apparatus that is suitable for use in the illumination system of a projection exposure apparatus used for lithographic processes in the manufacture of liquid crystal display panels and the like.

2. Discussion of the Related Art

In recent years, liquid crystal display panels have been widely used as display elements in personal computers and television sets, etc. Such liquid crystal display panels are manufactured by patterning transparent thin-film electrodes on a glass substrate into desired shapes by means of a photolithographic process. The photolithographic process employs a projection optical apparatus that exposes an original pattern (on a mask) onto a photo-resist layer on the glass substrate via a projection optical system.

Recently, there has been an increasing demand to expand the display area in the liquid crystal display panels. To cope with this trend, the exposure region of the projection exposure apparatus needs to be enlarged. A scan type exposure apparatus equipped with a plurality of projection optical systems has been proposed to expand the exposure region. In this system, an illuminating optical device having a plurality of illuminating optical systems is provided, and a mask is illuminated by light beams emitted from the respective illuminating optical systems so that images of the illuminated mask are projected onto the projection region of the glass substrate via the respective projection optical systems. Then, the entire area of the pattern region on the mask is transferred onto the glass substrate by scanning the mask and glass substrate in synchronization with each other with respect to the projection optical systems.

In order to simply and accurately control the amount of exposure in the plurality of illuminating optical systems in the above-mentioned scan type exposure apparatus, it is desirable that the illumination intensities in the respective illumination regions be uniform, and that the light intensities in the respective illumination regions be fixed during the scanning of the mask and glass substrate (or wafer). The applicant of the present invention previously disclosed in Japanese Laid-Open Patent Application No. 7-153683 (U.S. Pat. No. 5,581,075) an exposure apparatus in which a uniform illumination intensity is obtained at all the illumination regions by detecting the light beam produced from each of the illuminating optical systems of the projection optical systems, and by adjusting the illumination intensities of all the illuminating optical systems such that the adjusted illumination intensity matches the minimum intensity detected among the illumination regions.

In the exposure apparatus described above, a plurality of illuminating optical systems along with associated optical systems are arranged side by side in a row. Each of the illuminating optical systems include a light source having an elliptic mirror, a collimator lens system, a fly-eye lens, and a condenser lens system. Each of the associated optical system includes a mask, a projection optical system, and a substrate, in that order. An ND filter is installed between the light source and the collimator lens system in each optical system to adjust the intensity of the light beam of the corresponding illuminating optical system. Each ND filter includes a plurality of filters with different transmission coefficients and a filter driving device for engaging these filters. Each of the filters are inserted or retracted so as to generate a light beam with a desirable intensity for the respective illuminating optical system.

The ND filters of such an exposure apparatus generates a discrete variation in its light intensity, which is not suitable for fine tuning of the intensity. If the number of the ND filters is increased, this discontinuity can be reduced. However, in such a case, the overall size of the apparatus undesirably increases.

Meanwhile, in an effort to save energy consumption and reduce the overall size of the illuminating optical system, an exposure apparatus having a separate light source has been proposed. In this apparatus, light originating from the light source is divided into a plurality of light beams of equal intensity through a multi-branching random light guide and directed towards a plurality of illuminating optical systems. In this system, however, the light intensities in the respective illumination regions cannot be made sufficiently uniform due to variations in the transmissivity of the respective illuminating optical systems and projection optical systems, breakage of the optical fibers constituting the multi-branching random light guide, and other causes, such as variation in the manufacture of constituent parts. Accordingly, a light-intensity adjusting means as described above is indispensable in this case as well.

SUMMARY OF THE INVENTION

Accordingly, the present invention is directed to an illumination optical apparatus with an optical integrator that substantially obviates the problems due to limitations and disadvantages of the related art.

An object of the present invention is to provide an illumination optical apparatus that makes it possible to adjust the light intensity without discrete or discontinuous level separation.

Additional features and advantages of the invention will be set forth in the description that follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an illumination optical apparatus according to a first aspect of the invention is equipped with an optical integrator for forming a plurality of light source images on the basis of light from a light source, and an optical filter disposed in the light path on the light source side of the above-mentioned optical integrator and having a light passage region with a prescribed spread. In the illumination optical apparatus, the light passage region of the above-mentioned optical filter is constructed so that the light transmissivity varies continuously within this light passage region; a region overlapping the above-mentioned light path in the above-mentioned optical filter constitutes a portion of the above-mentioned light passage region; and the region overlapping the above-mentioned light path can be selected within the above-mentioned light passage region.

Here, besides forming a wedge-shape light-blocking pattern, the optical filter that is constructed so that the light transmissivity varies continuously may be any type of filter in which the light transmissivity varies continuously according to the position within the above-mentioned light passage region, e. g., a filter that is arranged so that a plurality of spot-form light-blocking patterns are varied from a sparse distribution to a dense distribution within the light passage region, a filter in which a plurality of spot-shape light-blocking patterns are distributed at a fixed density, with the size of the respective spots being gradually varied, a filter that is coated with a thin film whose light transmissivity is continuously varied within the light passage region, or an ND filter whose light transmissivity is continuously varied within the light passage region, etc.

When such a construction is used, the light passage region of the optical filter is 5 constructed so that the light transmissivity varies continuously within the light passage region. Furthermore, the apparatus is constructed so that the region, which overlaps the light path of the apparatus in the optical filter, can be selected within the above-mentioned light passage region. Accordingly, the light transmissivity is determined by the region selected, and the light transmissivity can vary continuously over time.

In a second aspect, the illumination optical apparatus according to the present invention includes, in addition to the invention described above, a relay optical system for conducting light from the above-mentioned light source to the above-mentioned optical integrator, and the above-mentioned optical filter is disposed in the light path between the above-mentioned relay optical system and the above-mentioned optical integrator.

With such a construction, the optical filter is disposed in the light path between the relay optical system and the above-mentioned optical integrator, i.e., on the light source side of the optical integrator. Accordingly, the uniformity of the distribution of the illumination intensity in the illumination region on the mask is increased.

In a third aspect of the illumination optical apparatus according to the present invention, 20 in addition to the invention described in the first or second aspects above, the above-mentioned optical integrator is constructed by disposing a plurality of optical elements corresponding to the above-mentioned plurality of light sources in a row at a first pitch, and the above-mentioned optical filter is constructed so that the light transmissivity varies continuously in a direction substantially perpendicular to the direction of the above-mentioned first pitch, and the light transmissivity varies periodically at a second pitch in the direction of the above-mentioned first pitch. Here, the period may include unit periodicity.

With this construction, the optical filter is constructed so that the light transmissivity varies periodically. Accordingly, design is relatively easy.

In the illumination optical apparatus according to a fourth aspect of the present invention, in addition to the invention described in the third aspect above, the apparatus is constructed so that the following condition is satisfied:

$$p_f = \frac{M}{\beta(M \cdot k + i)} P_0,$$

where $P_0$ is the above-mentioned first pitch, $P_f$ is the above-mentioned second pitch, M is the number of the above-mentioned optical elements in the direction of the above-mentioned first pitch, $\beta$ is the magnification of the optical system interposed between the above-mentioned optical filter and the above-mentioned optical integrator, k is a positive integer (including 0), and i is a positive integer less than M that cannot be factorized by any factor of M other than 1. Here, the magnification $\beta$ may be 1.

With such a construction, there is no interference between the optical elements making up the optical integrator and the periodicity of the optical filter. Accordingly, there is no irregularity in the illuminating light.

In a fifth aspect, the scan type projection exposure apparatus according to the present invention includes a first stage movable in a prescribed scanning direction for carrying a mask having a prescribed pattern formed thereon; a second stage movable in a prescribed scanning direction in synchronization with the above-mentioned first stage for carrying a substrate; a projection optical system for forming an image of the above-mentioned prescribed pattern onto the surface of the above-mentioned substrate; and the illuminating optical system described in the third or fourth aspect above. In the scan type projection exposure apparatus, the light transmissivity of the above-mentioned optical filter varies depending on the direction of movement of the above-mentioned first and second stages.

In this case, the apparatus is constructed so that the direction in which the light transmissivity of the optical filter varies corresponds to the direction of movement of the above-mentioned first and second stages. Accordingly, the effect of the gradient in the light intensity, which can be suppressed to an extremely small effect if the pitch of the optical elements making up the optical integrator in the direction in which the above-mentioned light transmissivity varies is set at a small value (but which always tends to be generated) can be eliminated.

An illuminating optical assembly of the invention according to a sixth aspect of the present invention includes one or more light sources; a plurality of the illumination optical apparatus described in any one of the aspects 1 through 4 above; and a light guide having input terminals that are equal in number to the above-mentioned light sources and are respectively connected to these light sources, and emission terminals that are equal in number to the above-mentioned illuminating optical systems and are respectively connected to these illumination optical apparatus.

With such a construction, an illuminating optical assembly can allow a continuous variation of the light intensity.

An optical filter according to a seventh aspect of the present invention includes an optical filter that is installed and used in the light path of the illuminating light of an illumination optical apparatus equipped with an optical integrator that forms a plurality of light source images. This optical filter is constructed so that the light transmissivity is continuously varied by forming a wedge-shape light-blocking pattern whose width is varied in the region of the optical filter through which light passes.

In such an optical filter, a wedge-shape light-blocking pattern with a varying width is formed. Accordingly, the design and manufacture are easy, and the light transmissivity can be reliably caused to vary in a continuous manner according to the position within the corresponding region.

In another aspect, the present invention provides an illumination optical apparatus including a light source emitting an illumination light beam, the illumination light beam being directed along a predetermined optical path; a variable optical filter disposed on the predetermined optical path of the illumination light beam for controlling the intensity of the illumination light beam, a transmissivity of the variable optical filter with respect to the illumination light beam being continuously variable; and an optical integrator receiving the illumination light beam that has passed through the variable optical filter to form a plurality of images of the light source.

In another aspect, the present invention provides a scan type projection exposure apparatus for projecting a mask pattern on a mask onto a substrate with an illumination light beam, the scan type projection exposure apparatus including a first stage for holding the mask, the first stage being movable in a first predetermined direction; a second stage for holding the substrate, the second stage being movable in a direction corresponding to the first predetermined direction in synchronization with movement of the first stage; an illumination optical system including a light source emitting the illumination light beam, the illumination light beam being directed along a predetermined optical path, a variable optical filter disposed on the predetermined optical path of the illumination light beam for controlling the intensity of the illumination light beam, a transmissivity of the variable optical filter with respect to the illumination light beam being continuously variable, and an optical integrator receiving the illumination light beam that has passed through the variable optical filter to form a plurality of images of the light source, the optical integrator including a plurality of optical elements disposed in a row at a first predetermined pitch along a second predetermined direction substantially perpendicular to the first predetermined direction, wherein the light transmissivity of the variable optical filter varies monotonically in a direction corresponding to the first predetermined direction, the light transmissivity of the variable optical filter varying periodically at a second predetermined pitch along the second predetermined direction; and a projection optical system for forming an image of the mask pattern on the mask onto the substrate with light beams from the plurality of images of the light source formed by the optical integrator.

In another aspect, the present invention provides an illumination optical apparatus including a plurality of light sources each emitting an illumination light beam; a plurality of illumination optical systems for processing illumination light beams from the plurality of light sources; and a light guide having a plurality of input terminals coupled to the plurality of light sources for receiving the illumination light beams from the respective light sources and a plurality of emission terminals coupled to the plurality of illumination optical systems for distributing the received illumination light beams among the plurality of illumination optical systems, each of the distributed illumination light beams being directed along a respective predetermined optical path, wherein each of the plurality of illumination optical systems includes a variable optical filter disposed on the respective predetermined optical path of the distributed illumination light beam for controlling the intensity of the distributed illumination light beam, a transmissivity of the variable optical filter with respect to the distributed illumination light beam being continuously variable, and an optical integrator receiving the distributed illumination light beam that has passed through the variable optical filter to form a plurality of images of the light source.

In another aspect, the present invention provides an illumination optical apparatus including a plurality of illumination optical systems, each including a light source emitting an illumination light beam, the illumination light beam being directed along a predetermined optical path, a variable optical filter disposed on the predetermined optical path of the illumination light beam for controlling the intensity of the illumination light beam, a transmissivity of the variable optical filter with respect to the illumination light beam being continuously variable, an optical integrator receiving the illumination light beam that has passed through the variable optical filter to form a plurality of images of the light source, and a light intensity monitor for outputting signals indicating the intensity of light beams emerging from the optical integrator; and a controller communicating with each of the light intensity monitors and controlling each of the variable optical filter, the controller controlling each of the variable optical filter in accordance with the signals indicating the intensity of the respective light beams from the optical integrator to adjust the intensity by feedback control.

In a further aspect, the present invention provides an optical filter to be installed in an illumination optical system having a light source and an optical integrator for producing a plurality of images of the light source, the optical filter including a transparent plate; and a plurality of elongated wedge-shape light-blocking patterns arranged substantially in parallel with each other along a predetermined direction on the transparent plate, each of the elongated wedge-shape light-blocking pattern extending in a direction substantially perpendicular to the predetermined direction with the width thereof monotonically changing so that a transmissivity of the optical filter with respect to light from the light source can be continuously variable.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings. The same or like elements in the respective figures are labeled with the same or like reference symbols, and once introduced, the descriptions thereof are not repeated so as to avoid redundancy.

First Preferred Embodiment

Figure 1:
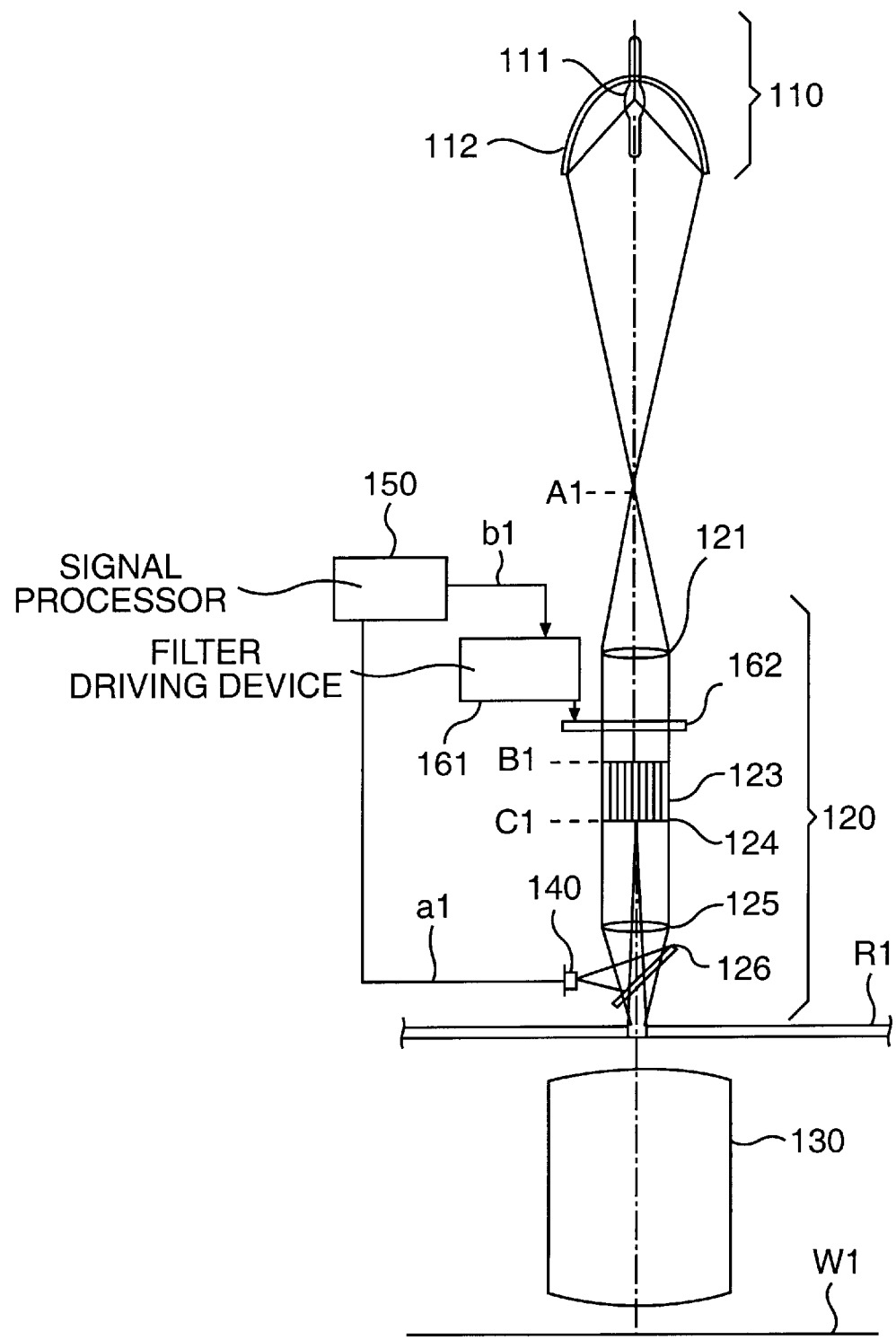
FIG. 1 is a schematic view of an illumination optical apparatus according to a first preferred embodiment of the present invention.

FIG. 1 illustrates an illuminating optical system according to a first preferred embodiment of the present invention. In the present embodiment, the illumination optical apparatus of the present invention is applied to the illumination system of an exposure apparatus used in the manufacture of semiconductor elements or liquid crystal display elements. In FIG. 1, a light source system 110 includes an elliptic mirror 112 and a light source 111 placed at the first focal position of the elliptic mirror 112. A mercury lamp that outputs light of the g-line (436 nm), i-line (365 nm) or h-line (407 nm) can be used as the light source 111.

A collimator lens 121, optical integrator 123, and a condenser lens 125, which collectively constitute an illumination system 120, are installed in that order along the light path of the light source system 110, thus constructing an illumination optical apparatus for illuminating a reticle R1 (mask). Here, the collimator lens 121 together with the elliptic mirror 112 may be regarded as a relay optical system for guiding the illumination light from the light source 111 towards the optical integrator 123.

In the illumination optical apparatus, an optical filter 162 is inserted between the collimator lens 121 and the entry surface B1 of the optical integrator 123. Further, a half-mirror 126 is installed between the condenser lens 125 and the reticle R1 (defining an illumination surface) at an angle of approximately 45 degrees with respect to the optical axis of the illumination system 120 to extract a portion of the light from the illumination system 120 to the outside. Moreover, a detector 140 is installed at the image plane formed by the light reflected through the half-mirror 126. Also, a circular aperture stop (diaphragm) 124 is installed at the position of the emission surface C1 of the optical integrator 123.

A projection optical system 130 is installed between the reticle R1 and the exposure surface of a wafer W1 (substrate) to project the image of the reticle pattern on reticle R1 onto the substrate (shown as a line in FIG. 1).

Figure 8A:
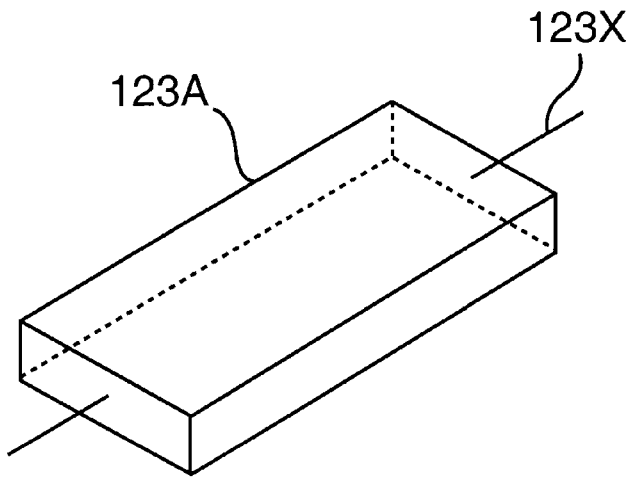
FIGS. 8A and 8B illustrate optical integrators for use in the preferred embodiments of the present invention.
Figure 8B:
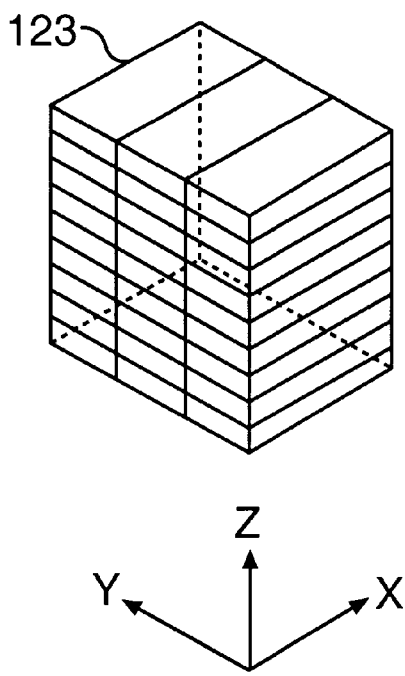

Next, the operation of this apparatus will be described. In FIG. 1, the light from the light source 111 forms the image of the light source 111 at the second focal position Al of elliptic mirror 112 due to the focusing property of the elliptic mirror 112. The light from the second focal position A1 is converted into a parallel light beam through collimator lens 121, and is directed onto the entry surface B1 of optical integrator 123. The optical integrator 123 is constructed by lining up a plurality of lens elements 123A each having a rectangular cross-section, as shown in FIG. 8A, in the directions perpendicular to the optical axes 123 X of the lens elements 123A, as shown in FIG. 8B.

Each of the lens elements 123A has the same focal length and optical path length. Accordingly, the parallel light from the collimator lens 121 that is incident on the entry surface of each lens element is focused to form the image of the light source on the emission surface of each lens element. In other words, in FIG. 1, a plurality of light source images are formed on the emission surface C1 of the optical integrator 123 in accordance with the arrangement of the lens elements 123A.

The light beams from the plurality of the light source images on the emission surface C1 of the optical integrator 123 is converted into light beams each having a circular cross-section through the circular aperture stop (diaphragm) 124, which is installed immediately after the optical integrator 123. The resultant light is incident on the condenser lens 125.

Since the illumination surface on reticle R1 is positioned approximately at the rear focal position of the condenser lens 125, the entry surfaces B1 of the respective lens elements 123A of the optical integrator 123 and the illumination surface on reticle R1 are related in a substantially conjugate manner. Accordingly, the light beams from a plurality of secondary light sources (the plurality of the light source images) formed on the emission surface C1 of the optical integrator 123 illuminate the illumination surface on reticle R1 in a superimposing manner.

Furthermore, as described above, the half-mirror 126 is installed between the optical integrator 123 and the illumination surface on reticle R1 to extract and guide a portion of the light towards the detector 140. The detector 140 constantly monitors the intensity of the extracted light, and outputs a signal a1 indicating the detected intensity. A signal processor 150 receives and processes the signal a1 to derive the intensity of the light that is actually illuminating the illumination surface on reticle R1, and outputs a signal b1 to a filter driving device 161 installed between the collimator lens 121 and the optical integrator 123 for driving the filter 162 to maintain the monitored intensity of the illumination light to a predetermined constant value.

Figure 2:
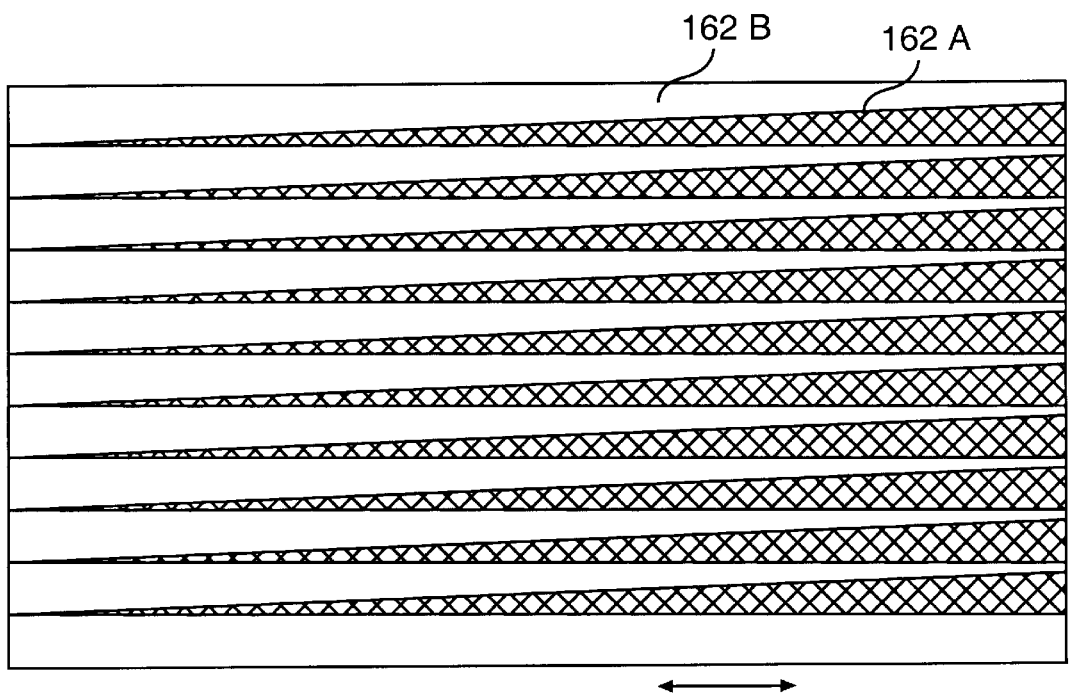
FIG. 2 shows an example of the pattern layout in an optical filter according to the first preferred embodiment of the present invention.

The filter driving device 161 is constructed so that a transmissivity-variable filter as the optical filter 162 can be moved through the light path of the illumination light. FIG. 2 shows an example of the transmissivity-variable filter 162. The transmissivity-variable filter 162 of FIG. 2 has a light-blocking pattern of a wedge-like shape with the width changing gradually (monotonically and linearly in the present preferred embodiment), as indicated by reference numeral 162A in FIG. 2. The filter 162 is constructed by arranging a plurality of such patterns in parallel. This filter may be manufactured by forming the wedge-shape light-blocking patterns on the surface of a parallel flat glass, for example.

If the illumination position on the transmissivity-variable filter 162 is moved relative to the filter 162 in the direction indicated by the arrows in FIG. 2, this filter can produce a continuous variation in the light transmissivity, thereby serving as a light-adjusting means.

The filter driving device 161 controls the light transmissivity by positioning the transmissivity-variable filter 162 in accordance with the signal b1 inputted from the signal processor 150, as shown in FIG. 1.

In a projection exposure apparatus, it is necessary to increase the uniformity in the intensity of illumination at the illumination region on the mask R1 in order to expose the pattern onto the exposed substrate W1 with a high resolution. The cross-section of the light beam that emerges through the transmissivity-variable filter 162 exhibits a wedge-shape light distribution reflecting the pattern shape of the transmissivity-variable filter 162. Accordingly, to obtain desirable uniformity in the distribution of the illumination intensity, it is preferable to install the transmissivity-variable filter 162 at the light source side of the optical integrator 123, as in FIG. 1.

Using the above-described filter, an illumination optical apparatus is obtained that has a high degree of uniformity in illumination intensity and is capable of continuously varying the intensity of illumination. Moreover, when the transmissivity-variable filter 162 is inserted between the collimator lens 121 and the optical integrator 123, as in FIG.

1, the uniformity in the intensity of illumination on the illumination region on the mask can be further improved by the following scheme.

Figure 3:
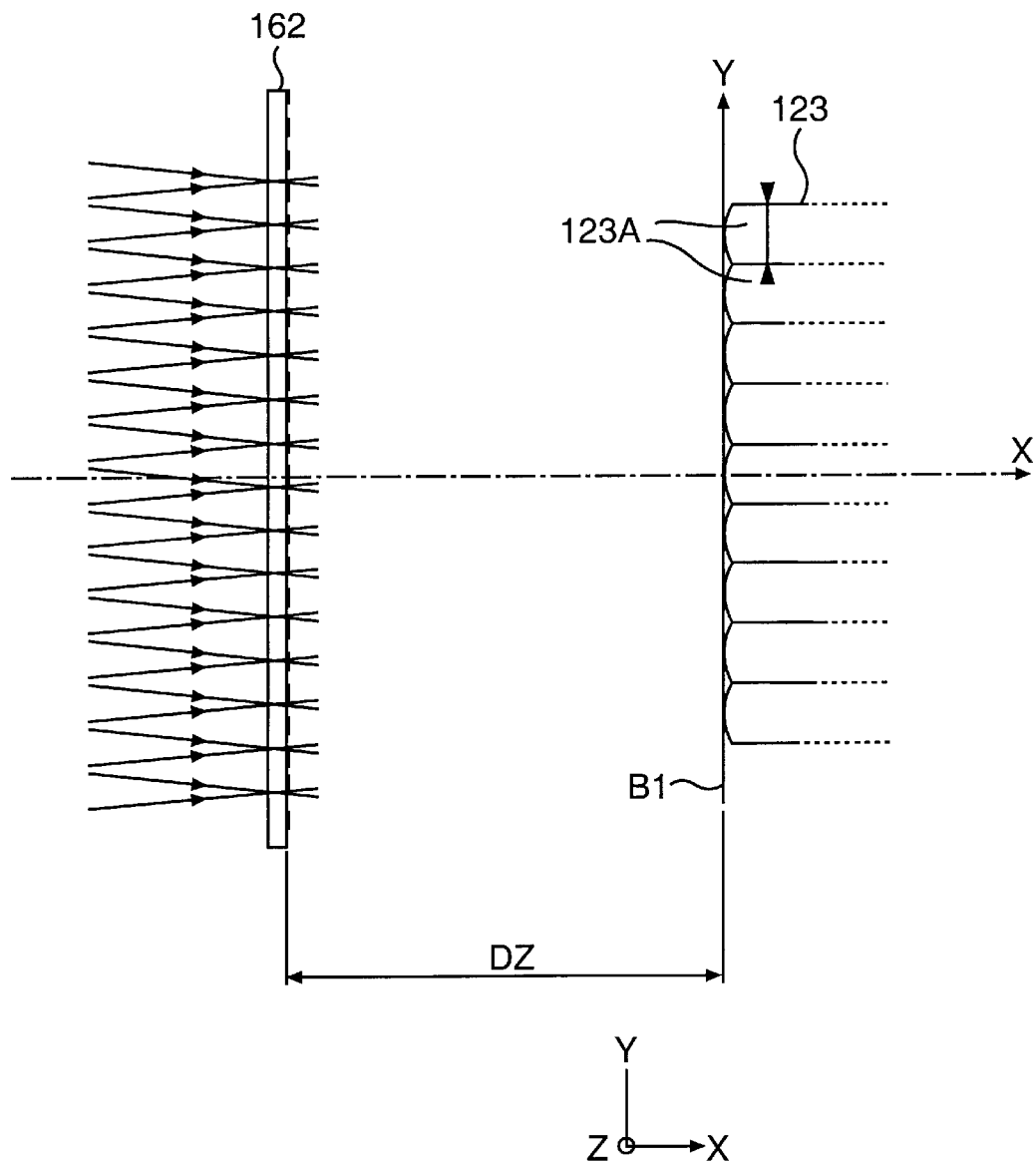
FIG. 3 shows the spacial relationship between the optical integrator and the transmissivity-variable filter of the illumination optical apparatus according to the first preferred embodiment of the present invention.

With reference to FIG. 3, the relationship between the light-blocking pattern and the optical integrator will be described in more detail. In FIG. 3, the X axis is taken along the optical axis, the Y axis is taken along the vertical direction of the page of FIG. 3, i.e., in the direction perpendicular to the X axis, and the Z axis is taken normal to the page. Here, as shown in FIGS. 8A and 8B, the optical integrator is constructed by arranging a plurality of lens elements each having a rectangular cross-section in the transverse (lateral) directions, with M lens elements being lined up in the Y direction and N lens elements being lined up in the Z direction (see FIG. 3). Furthermore, the transmissivity-variable filter is arranged so that the wedge-shape patterns extend in the Z direction and are lined up side by side at a predetermined interval along the Y direction (in a periodic arrangement). FIG. 3 is a cross-sectional view of the optical system including the optical integrator 123 and transmissivity-variable filter 162 taken along a plane $Z=Z_0$, which is parallel to the XY plane.

In the following description, w indicates the width of each pattern at the transmissivity-variable filter at the $Z=Z_0$ plane and p indicates the pitch of the patterns. Further, in order to simplify the description, a simplified model is used in which only light rays in the plane Z=Z0 are considered, and the intensity of the light entering the transmissivity-variable filter 162 is assumed to be uniform and equal to $W_0$ mW/cm$^2$.

The transmissivity of the light-blocking parts 1 62A (FIG. 2) of the transmissivity-variable filter 162 is assumed to be 0%, and the transmissivity of transparent portions 162B of the filter 162 is assumed to be 100%. Furthermore, it is assumed that light beams having a predetermined numerical aperture NA are incident at the respective positions on the transmissivity-variable filter 162. In FIG. 3, the distance between the bottom surface (right surface in FIG. 3) of the transmissivity-variable filter 162 and the entry surface B1 of the optical integrator 123 is indicated by DZ.

Figure 4:
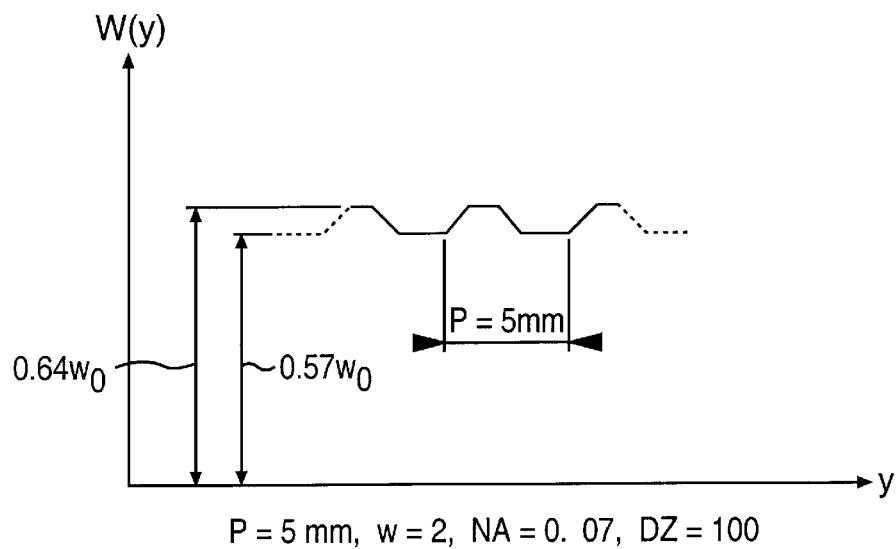
FIG. 4 is a graph showing the intensity distribution of the light at the entry surface of an optical integrator when light-blocking patterns have a predetermined pitch according to the first preferred embodiment of the present invention.

FIG. 4 shows intensity distribution W(y) of the illumination light at the entry surface B1 of the optical integrator 123 as a function of the Y-coordinate. In FIG. 4, p=5 mm, w=2 mm, DZ=100 mm, and NA=0.07. According to the graph of FIG. 4, the light intensity at the entry surface B1 of the optical integrator 123 varies periodically: the pitch P is 5 mm, the maximum light quantity Wmax is 0.64×$W_0$ mW/cm$^2$, and the minimum light quantity Wmin is 0.57×$W_0$ mW/cm$^2$ in this particular configuration.

Through the optical integrator 123, the illumination light incident on the entry surface B1 of the optical integrator 123 is split into a plurality of light beams with the cross-sectional dimension ξ×η and is directed towards the substrate (or wafer) in a superimposing manner.

Figure 5:
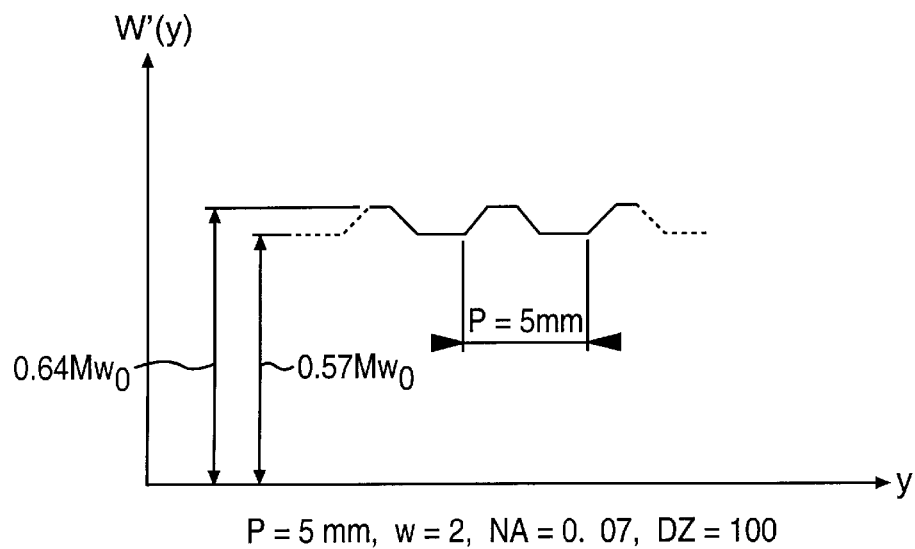
FIG. 5 is a graph showing the intensity distribution of the light at the illuminated surface of a reticle when the pitch of the light-blocking patterns coincides with the pitch of lens elements of the optical integrator in the first preferred embodiment of the present invention.

Here, as will be easily understood, the poorest uniformity in the light intensity on the illumination surface occurs when the pitch of W(y) and the pitch between the lens elements 123A of the optical integrator 123 coincide, or when the ratio of these pitches (ξ/P) is an integer. Suppose that the intensity of the light incident on the entry surface B1 of the optical integrator is given in FIG. 4, and the magnification between the entry surfaces B1 of the lens elements of the optical integrator and the illuminated surface on the substrate (reticle) is equal magnification (×+1). Then, if the pitch of the periodicity in W(y) and the pitch between the lens elements 123A coincide; i.e., P=p=ξ=5 mm, the light quantity distribution W'(y) on the illumination surface of the substrate is given in FIG. 5 (w=2 mm, DZ=100 mm, NA=0.07). The uniformity U of the light intensity, which is defined by U={maximum value of W'(y)−minimum value of W'(y)}/{maximum value of W'(y)+minimum value of W'(y)}, becomes 5.8% in this case.

It is expected that the uniformity U of the light intensity will improve if the above relationship between P (=p) and ξ is broken. Suppose that the intensity distribution W(y) of the light incident on the entry surface B1 of the optical integrator is given in FIG. 4 (P=p=5 mm, w=2 mm, DZ=100 mm, NA=0.07) and the outer dimension ξ of the lens elements 123A of the optical integrator are set to 5.5 mm with seven (7) lens elements 123A disposed in the Y direction (M=7). Then, the uniformity U in the light intensity on the illuminated surface becomes 2.5%.

In recent years, an even better uniformity in light intensity has been required. A modified first preferred embodiment of the transmissivity-variable filter that meets this requirement will be described below. In this preferred embodiment, the uniformity of the light intensity is further improved throughout the illumination region without having discontinuous variations in the light intensity. Furthermore, an illumination optical apparatus with a light-intensity adjusting device that does not affect the uniformity in the light intensity on the illuminated surface can be obtained.

The light-blocking patterns 162A on the transmissivity-variable filter 162 according to the present preferred embodiment of the optical filter satisfy the following Equation (1).

$$p = \frac{M}{\beta(M \cdot k + i)} \xi, \qquad (1)$$

where ξ×η represents the cross-sectional dimensions of each lens element 123A of the optical integrator, M×N represents the number of lens elements 1 23A lined up in the respective directions, and p represents the pitch of the light-blocking patterns in the transmissivity-variable filter 162. In addition, k is a non-negative integer (including 0), i is a positive integer less than M that cannot be factorized by any factor of M other than 1, and β is the magnification of the optical system interposed between the optical filter 162 and the optical integrator 123. The optical system may have a unit magnification β=1. If there is no projection optical system, then β is 1. Below, the case of β=1 will be described for simplicity.

When the Equation (1) is satisfied, the optimum uniformity can be obtained in the intensity of the light illuminating the illumination surface on reticle R1. This will be explained below with reference to FIG. 3. Here, the optical integrator 123 is constructed by arranging a plurality of lens elements 123A each having a rectangular cross-section in the transverse (lateral) directions, with M lens elements being lined up in the Y direction, and N lens elements being lined up in the Z direction. Furthermore, in the transmissivity-variable filter 162, a plurality of wedge-shape light-blocking patterns each extending in the Z direction are lined up side by side at a predetermined interval along the Y direction (in a periodic arrangement). FIG. 3 is a sectional view of the optical system along a plane $Z=Z_0$ parallel to the XY plane.

As before, w represents the width of the light-blocking patterns on the transmissivity-variable filter 162 at the plane $Z=Z_0$, and p represents the pitch of the patterns. For simplicity, the following description uses a simplified model in which only light rays that pass through this plane $Z=Z_0$ are considered and the intensity of the light entering the transmissivity-variable filter 162 is assumed to be uniform with intensity $W_0$ mW/cm$^2$.

Furthermore, the transmissivity of the light-blocking patterns 162A (FIG. 2) of the transmissivity-variable filter 162 is assumed to be 0%, and the transmissivity of the transparent portions 162B of the filter is assumed to be 100%. The light incident on the transmissivity-variable filter 162 is assumed to have a fixed numerical aperture NA. Moreover, the distance between the bottom surface (right surface in FIG. 3) of the transmissivity-variable filter 162 and the entry surface B1 of the optical integrator 123 is indicated by DZ.

With this setup, the intensity distribution W(y) of the light at the entry surface B1 of the optical integrator 123 can be expressed as follows:

$$W(y) = W_0 \cdot f\left(y - \left[\frac{y}{p}\right]P + \phi_0\right) \quad (2)$$

Here, [ ] is a Gauss bracket, which gives a maximum integer that does not exceed a real number in the bracket. Function f($\zeta$) is defined in range $0 \leq \zeta < P$ and satisfies $0 \leq f(\zeta) \leq 1$. The function f is an arbitrary function representing a packet of the light intensity, which is repeated in W(y) with period P in the Y direction. This can easily be seen by the specific form of the argument in the function f in Equation (2). In other words, W(y) is established by periodically lining up the function f(y) at pitch P (=p). $\phi_0$ is a constant representing a correction factor determined by the relative positional relationship between the optical integrator 123 and transmissivity-variable filter 162 ($0\phi_0 < P$). For example, when p=5 mm, w=2 mm, DZ=100 mm, and NA=0.07, Equation (2) yields the graph shown in FIG. 4.

In general, the maximum and minimum values of W(y) are obtained as follows:

$$\text{Max}\{W(y)\} = W_0 \cdot \left\{\left[\frac{\Gamma}{p}\right](P-w) + dim(P - \Delta - w)\right\} \quad (3)$$

$$\text{Min}\{W(y)\} = W_0 \cdot \left\{\left[\frac{\Gamma}{p}\right](P-w) + dim(\Delta - w)\right\} \quad (4)$$

Here, $\Gamma \equiv 2 \cdot NA \cdot DZ$, $\Delta \equiv \Gamma - \left[\frac{\Gamma}{p}\right]P$, $P = p$, $$dim(\zeta_1 - \zeta_0) = 0 \quad (\text{if } \zeta_1 < \zeta_0) \quad (5)$$
$$= \zeta_1 - \zeta_0 \quad (\text{if } \zeta_1 \geq \zeta_0)$$

The illumination light incident on the entry surface B1 of the optical integrator 123 is split in accordance with the cross-sectional shapes of the lens elements 123A, and the resulting light beams are superimposed with each other at the illumination surface of reticle R1. Accordingly, by representing the position in the illumination surface on reticle R1 as the position of one of the corresponding conjugate points at the entry surface B1 of the optical integrator 123, the light intensity distribution W'(y) at the illumination surface on reticle R1 is given as follows:

$$W'(y) = \sum_{m=0}^{M-1} W(y + m\cdot\xi) = W_0 \sum_{m=0}^{M-1} f\left(y + m\cdot\xi - \left[\frac{y + m\cdot\xi}{P}\right]P + \phi_0\right) \quad (6)$$

Assuming that f($\xi$) may take any functional form (as a continuous function) as long as the boundary condition with respect to the range $0 \leq \xi < P$ are satisfied (f can also be regarded as a periodic function with period P), the function f satisfies the following relationship, which will be used to eliminate Y-dependency in W'(y).

$$\lim_{m \to \infty} \frac{P}{M} \sum_{m=0}^{M-1} f\left(\phi_0 + \frac{P}{M}m\right) = \int_0^P f(\zeta)d\zeta = \text{constant} \quad (7)$$

This shows that with large enough M, the quantity in the left hand side of Equation (7) does not depend on the value of $\phi_0$. That is, the dependency on $\phi_0$ of the left hand side of Equation (7) is reasonably eliminated with large M as long as the function f($\zeta$) does not change too drastically with the variable $\zeta$. Through this observation, it is readily noted that the following relationship needs to be satisfied to eliminate the Y coordinate dependancy in function W'(y) of Equation (6).

$$\left\{y + (m+1)\cdot\xi - \left[\frac{y + (m+1)\cdot\xi}{P}\right]P + (m+1)\cdot\xi + \phi_0\right\} - \quad (8)$$
$$\left\{y + m\cdot\xi - \left[\frac{y + m\cdot\xi}{P}\right]P + m\cdot\xi + \phi_0\right\} =$$
$$\xi - \left\{\left[\frac{y + (m+1)\cdot\xi}{P}\right] - \left[\frac{y + m\cdot\xi}{P}\right]\right\}P = \xi - k\cdot P =$$
$$\frac{P}{M}\left(k \equiv \left[\frac{y + (m+1)\cdot\xi}{P}\right] - \left[\frac{y + m\cdot\xi}{P}\right]\right) \therefore P = p = \frac{M}{M\cdot k + 1}\xi$$

Here, k is a non-negative integer (including 0).

By a similar consideration, cases in which the following relationship is satisfied are also included (for example) when M is an odd number.

$$\xi - k\cdot P = \frac{2P}{M}, \therefore P = p = \frac{M}{M\cdot k + 2}\xi \quad (9)$$

Here, k is a non-negative integer (including 0).

If such an approach is adopted, then Equations (8) and (9) can be summarized by the following Equation (10).

$$\xi - k\cdot P = \frac{iP}{M}, \therefore P = p = \frac{M}{M\cdot k + i}\xi \quad (10)$$

Here, k is a non-negative integer (including 0), and i is a positive integer smaller than M and cannot be factorized by any factor of M (except 1). This completes the derivation of Equation (1) in the case of $\beta=1$.

For example, suppose that the intensity distribution of light incident on the entry surface B1 of the optical integrator 123 is given as shown in FIG. 4 (p=5 mm, w=2 mm, DZ=100 mm, NA=0.07), and the number of lens elements lined up in the optical integrator 123 is 7 (M=7) and the cross-sectional dimension of the lens elements is 15.714 (obtained by substituting into Equations (1) with i=1 and k=3), the uniformity U of the light intensity on the illumination surface of reticle R1 (utilizing Equation (6)) is reduced to approximately 0.1%.

Above, a parallel flat glass with wedge-shape light-blocking patterns each having a gradient is used as an example. A similar effect can be obtained using a different optical member in which a transmissivity gradient is realized by varying the density of dot patterns or the film thickness of a metal film, etc.

Second Preferred Embodiment

Next, a second preferred embodiment of the present invention will be described with reference to FIG. 6. In this preferred embodiment, the illumination optical apparatus of the present invention is applied to the illumination system of an exposure apparatus used in the manufacture of semiconductor elements or liquid crystal display elements.

Figure 6:
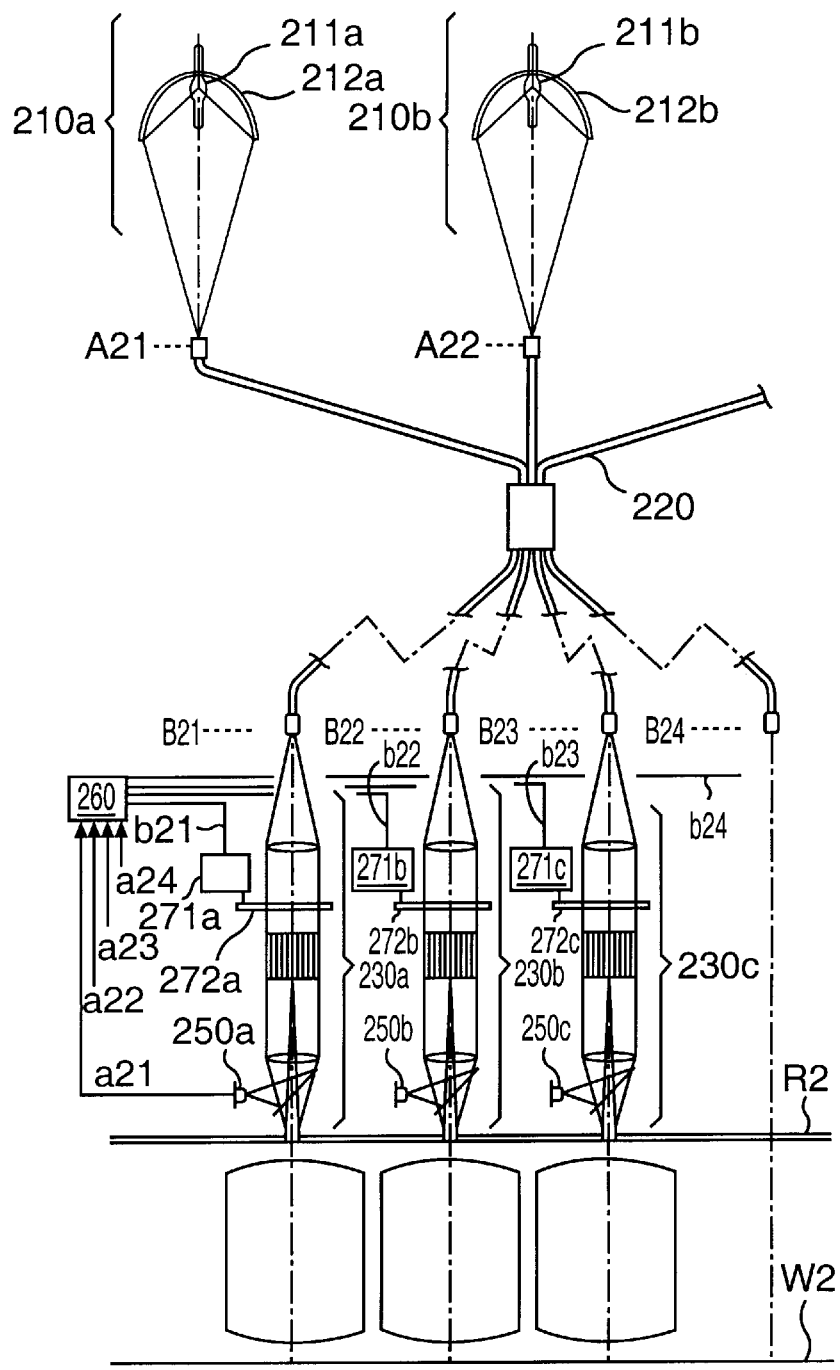
FIG. 6 is a schematic view of an illumination optical apparatus according to a second preferred embodiment of the present invention.

FIG. 6 shows an illumination optical apparatus according to the present embodiment. This apparatus includes, for example, three light sources 211a to 211c (211c is not shown in the figure) and three elliptic mirrors 212a to 212c (212c is not shown in the figures). In this second preferred embodiment, the respective parts have the same construction. However, these parts may have different constructions, and the number of the same or like parts is not limited to three. The respective combinations of the three light sources 211a to 211c and elliptic mirrors 212a to 212c have the same construction as the light source 111 and elliptic mirror 112 in the first preferred embodiment shown in FIG. 1. Accordingly, the light beams from the light sources 211a to 211c are focused at the second focal positions A21 to A23 (A23 is not shown in the figure) of the respective elliptic mirrors 212a to 212c, forming the respective light source images.

The light rays from the light source images at the positions A21 to A23 enter a light guide 220 through input terminals disposed at the positions A21 through A23. The number of the input terminals of the light guide 220 corresponds to the number of the light sources (three in this embodiment). The light guide 220 also has a plurality of emission terminals, the number of which corresponds to the number of illumination systems disposed after the light guide 220 (four illumination systems exist in this embodiment). Between the input terminals and emission terminals, the optical fibers in the light guide 220 are randomly mixed so that the light rays from the three light sources entering via the respective input terminals are substantially uniformly distributed among the four emission terminals.

Furthermore, illumination systems 230a to 230d (230d is not shown in the figure) are installed after the respective emission terminals of the light guide 220 to receive the light rays from the light guide 220. Accordingly, the end faces B21 to B24 of the respective emission terminals of the light guide 220 effectively become secondary light sources.

The illumination systems 230a to 230d have the same construction as the optical system 120 disposed between the point A1 and the illumination surface of reticle R1 in the first preferred embodiment. The illumination systems 230a through 230d are arranged side by side. Therefore, each of the light beams from the secondary light sources at the end faces B21 to B24 of the respective emission terminals of the light guide 220 is converted into a parallel light flux by the respective collimator lens, and the parallel light flux is converted through the respective optical integrator to yield a light beam with a uniform intensity distribution. Each of the thus generated light beams illuminates reticle R2, thereby producing a plurality of illuminated areas on reticle R2.

As in the first preferred embodiment shown in FIG. 1, a half-mirror is installed in each illumination system between the optical integrator and the illuminated surface of reticle R2 so that a portion of the respective light beam is extracted and guided towards a respective detector (250a to 250d, 250d is not shown in the figure). The detectors 250a to 250d constantly monitor the intensity of the light beams guided to these detectors, and output the signals a21 to a24 indicating the respective light intensities to a signal processor 260 (corresponding to signal processor 150 in FIG. 1). The signal processor 260 derives the intensities of the respective light beams of the illumination system 230a through 230d illuminating the illuminated surface R2 on the basis of the signals a21 through a24, and outputs signals b21 through b24 to respective filter driving devices 271a to 271d (271d is not shown in the figure) installed between the collimator lenses and the optical integrators to equalize the intensities of the respective light beams.

In a similar manner to the first preferred embodiment, the filter driving devices 271a through 271d are adapted to move respective transmissivity-variable filters 272a to 272d (272d is not shown in the figure) of the type shown in FIG. 2 through the respective light paths. Accordingly, the filter driving devices 271a to 271d can vary the intensities of the respective light beams of the illumination system 230a to 230d in a continuous manner.

The filter driving devices 271a through 271d control the transmissivities for the light beams by positioning the transmissivity-variable filters 272a through 272d on the basis of the signals b21 through b24 from the signal processor 260. As in the first preferred embodiment, the pitch p of the light-blocking patterns on the transmissivity-variable filters 272a to 272d is determined such that the relationship of this pitch with the cross-sectional dimensions and the number of the lens elements in the optical integrators satisfy Equation (10) in each illumination system. When this condition is satisfied, the uniformity in the intensities of the light beams from the respective illumination system 230a through 230d is maintained at an optimal level.

Third Preferred Embodiment

Figure 7:
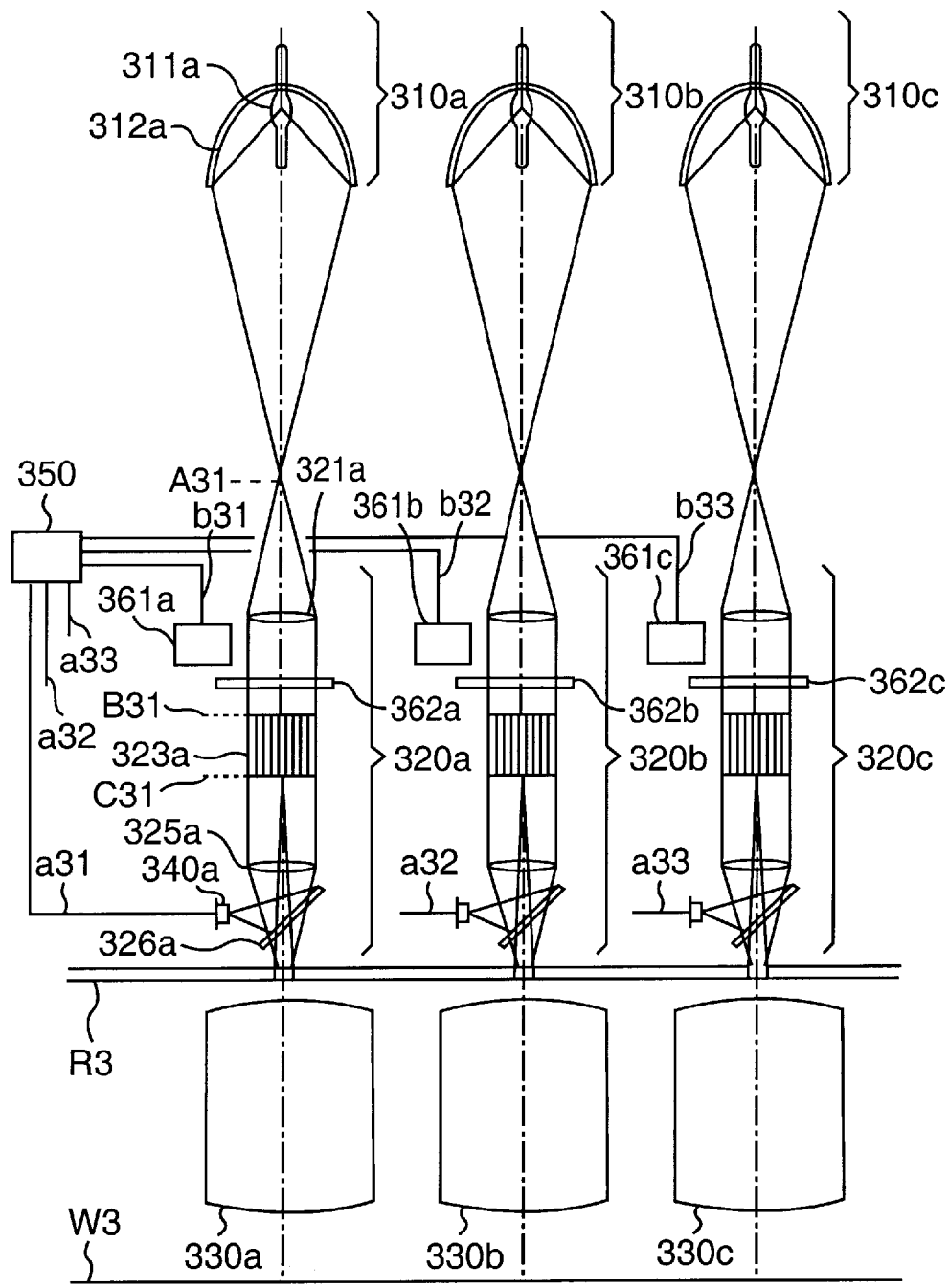
FIG. 7 is a schematic view of an illumination optical apparatus according to a third preferred embodiment of the present invention.

FIG. 7 illustrates a third preferred embodiment of the present invention. In this embodiment, a plurality of the illumination optical apparatus including the projection optical system of the first preferred embodiment of FIG. 1 are arranged side by side. An exposure apparatus shown in FIG. 7 has three projection optical systems 310a, 310b, and 310c and three corresponding illuminating optical systems 320a, 320b, and 320c. A light source 311a is installed at the first focal position of an elliptic mirror 312a (used as a focusing means) so that light emitted by the light source 311a is focused at the second focal position A31 of the elliptic mirror 312a, thus forming a light source image at point A31. In the illuminating optical system 320a, light from the light source image formed at point A31 is converted into a parallel light flux through the collimator lens 321a and enters an optical integrator 323a. The optical integrator 323a is constructed by arranging a plurality of optical lens elements adjacent to each other in the transverse (lateral) directions.

The light that has reached the entry surface B31 of the optical integrator is focused so that a plurality of light source images are formed at the light emission surface C31 of the optical integrator. Light beams from the plurality of light source images formed at the emission surface C31 enter the condenser lens 325a. Through the condenser lens 325a, the light beams are focused so that the original reticle pattern on the illumination surface of reticle R3 is uniformly illuminated with the superimposed light beams.

The light beams that have passed through the reticle R3 enter the projection optical system 330a and form the image of the reticle pattern on a photosensitive substrate W3 to project the reticle pattern onto the photosensitive substrate W3. The foregoing description applies to the other two illuminating optical systems 320b and 320c and projection optical systems 330b and 330c.

Furthermore, a half-mirror 326a is installed in the illumination system 320a to extract a portion of the light from the illumination system 320a and guide it towards a detector 340a. The detector 340a detects the intensity of the incident light and outputs a signal a31 indicating the intensity to a signal processor 350. Similarly, signals a32, a33 indicating the intensities of the respective light beams are sent to the signal processor 350 from the other illumination systems 320b and 320c.

The illuminating optical system 320a is further equipped with a transmissivity-variable filter 362a installed between the collimator lens 321a and the optical integrator 323a for adjusting the intensity of the respective light beam and a filter driving device 361a for driving the filter 362a. Similarly, transmissivity-variable filters 362b, 326c and filter driving devices 361b, 361c are provided in the other illumination systems 320b, 320c.

On the basis of the input signals a31 to a33, the signal processor 350 calculates the intensities of the respective light beams of the illumination system 320a to 320c. Based on the results of this calculation, the signal processor 350 outputs signals b31 to b33 to the filter driving devices 361a to 361c in the respective illumination systems 320a to 320c to control the intensities of the light beams to be consistent with each other.

On the basis of commands (corresponding to signals b31 to b33) from the signal processor 350, the filter driving devices 361a to 361b drive the respective transmissivity-variable filters in the lateral direction to adjust the light beams of the respective illumination optical systems such that the intensities of the light beams of all the illuminating optical systems are maintained at a target value. As a result of this feedback control, according to the exposure apparatus of the present embodiment, a uniform illumination intensity is obtained in all the illumination regions at all times.

According to the first to third preferred embodiments above, the light intensity in a lateral direction, along which the light-blocking patterns are periodically disposed on the transmissivity-variable filter, can be controlled to be uniform. However, in a direction perpendicular to this direction, i.e., in the direction in which the transmissivity of the transmissivity-variable filter varies continuously, there is always a gradient in the light intensity of illuminated region on the reticle. In a scan type optical apparatus, e.g., a scan type projection exposure apparatus, the effect of this gradient can be completely eliminated if the scanning direction is chosen to be the direction of the gradient in the light intensity. Furthermore, this gradient in the light intensity can be significantly reduced, to almost zero, by reducing the cross-sectional dimension η of the lens elements in the optical integrator in the direction of the gradient, i.e., by increasing the number N of the lens elements in that direction.

In the embodiments above, the transmissivity-variable filter has a plurality of light-blocking patterns. Alternatively, the transmissivity-variable filter may have only one light blocking pattern with no periodicity.

In the optical filter shown in FIG. 2, the light-blocking patterns are formed such that each of these patterns has a zero width at one end of the glass substrate and a maximum width at the other end. Alternatively, the transmissivity-variable filter of the present invention may have a entirely transparent region of a predetermined length, in which no light-blocking patterns are present, at one side, and light-blocking patterns with the width gradually increasing in a direction away from the transparent region.

Furthermore, in the above embodiments, a parallel flat glass having wedge-shape light-blocking patterns with a gradient are described as an example. However, a similar effect can be obtained by an optical member in which a transmissivity gradient is realized by varying the density of dot patterns or the film thickness of a metal film, etc.

In the illumination optical apparatus of the present invention, as described above, the light is adjusted using a filter that allows a continuous variation of the transmissivity. Accordingly, a uniform light intensity can always be obtained in the illumination region, without any discontinuous variation in the light intensity.

Furthermore, if the light intensity is adjusted using a parallel flat glass having wedge-shape light-blocking patterns disposed in parallel, the pitch of the light-blocking patterns and the pitch of the lens elements of the optical integrator can be appropriately adjusted. Accordingly, the present invention provides an illumination optical apparatus with a light-adjusting device that can provide a superior uniformity in the light intensity on the illumination surface of the reticle.

It will be apparent to those skilled in the art that various modifications and variations can be made in the illumination optical apparatus with an optical integrator of the present invention without departing from the spirit or scope of the invention. Thus, it is intended that the present invention cover the modifications and variations of this invention provided they come within the scope of the appended claims and their equivalents.

What is claimed is:

1. An illumination optical apparatus, comprising:
   a light source emitting an illumination light beam, the illumination light beam being directed along a predetermined optical path;
   a variable optical filter disposed on the predetermined optical path of the illumination light beam for controlling an intensity of the illumination light beam, a transmissivity of the variable optical filter with respect to the illumination light beam being continuously variable; and
   an optical integrator receiving the illumination light beam that has passed through the variable optical filter to form a plurality of images of the light source.

2. The illumination optical apparatus according to claim 1, further comprising a relay optical system for guiding the illumination light beam from the light source towards the optical integrator,
   wherein the variable optical filter is disposed between the relay optical system and the optical integrator.

3. The illumination optical apparatus according to claim 1, wherein the optical integrator includes a plurality of optical elements disposed in a row at a first predetermined pitch along a first predetermined direction, and
   wherein the transmissivity of the variable optical filter varies monotonically in a direction substantially perpendicular to the first predetermined direction in which the plurality of optical elements are disposed with the first predetermined pitch, the transmissivity of the variable optical filter varying periodically at a second predetermined pitch in a direction corresponding to the first predetermined direction.

4. The illumination optical apparatus according to claim 3, wherein the optical integrator and the variable optical filter are adapted to satisfy the following equation, $$p_f = \frac{M}{\beta(M \cdot k + i)} P_0,$$

where $P_0$ represents the first predetermined pitch, $p_f$ represents the second predetermined pitch, M represents the number of the optical elements disposed in the first predetermined direction with pitch $P_0$, β represents a magnification between the variable optical filter and the optical integrator, k represents a non-negative integer, and i represents a positive integer smaller than M that cannot be factorized by any factor of M other than 1.

5. The illumination optical apparatus according to claim 1, further comprising:
a light intensity monitor for outputting signals indicating the intensity of light beams emerging from the optical integrator;
a controller communicating with the light intensity monitor, and controlling the variable optical filter in accordance with the signals indicating the intensity of the light beams from the optical integrator to adjust the intensity by feedback control.

6. The illumination optical apparatus according to claim 5, wherein the light intensity monitor includes:
a half mirror for extracting a portion of the light beams from the optical integrator; and
a detector for detecting the intensity of the extracted portion of the light beams.

7. The illumination optical apparatus according to claim 5, wherein the controller includes:
a signal processor for processing the signals from the light intensity monitor indicating the intensity of the light beams from the optical integrator to output control signals for controlling the variable optical filter; and
a variable optical filter driver for moving the variable optical filter in a direction substantially perpendicular to the predetermined optical path of the illumination light beam in accordance with the control signals from the signal processor to continuously change the transmissivity of the variable optical filter with respect to the illumination light beam.

8. A scan type projection exposure apparatus for projecting a mask pattern on a mask onto a substrate with an illumination light beam, comprising:
a first stage for holding the mask, the first stage being movable in a first predetermined direction;
a second stage for holding the substrate, the second stage being movable in a direction corresponding to the first predetermined direction in synchronization with movement of the first stage;
an illumination optical system including;
a light source emitting the illumination light beam, the illumination light beam being directed along a predetermined optical path,
a variable optical filter disposed on the predetermined optical path of the illumination light beam for controlling an intensity of the illumination light beam, a transmissivity of the variable optical filter with respect to the illumination light beam being continuously variable, and
an optical integrator receiving the illumination light beam that has passed through the variable optical filter to form a plurality of images of the light source, the optical integrator including a plurality of optical elements disposed in a row at a first predetermined pitch along a second predetermined direction substantially perpendicular to the first predetermined direction,
wherein the light transmissivity of the variable optical filter varies monotonically in a direction corresponding to the first predetermined direction, the light transmissivity of the variable optical filter varying periodically at a second predetermined pitch along the second predetermined direction; and
a projection optical system for forming an image of the mask pattern on the mask onto the substrate with light beams from the plurality of images of the light source formed by the optical integrator.

9. The scan type projection exposure apparatus according to claim 8, wherein the optical integrator and the variable optical filter are adapted to satisfy the following equation, $$p_f = \frac{M}{\beta(M \cdot k + i)} P_0,$$

where $P_0$ represents the first predetermined pitch, $p_f$ represents the second predetermined pitch, M represents the number of the optical elements disposed in the second predetermined direction with pitch $P_0$, $\beta$ represents a magnification between the variable optical filter and the optical integrator, k represents a non-negative integer, and i represents a positive integer smaller than M that cannot be factorized by any factor of M other than 1.

10. An illumination optical apparatus, comprising:
a plurality of light sources each emitting an illumination light beam;
a plurality of illumination optical systems for processing the illumination light beams from the plurality of light sources; and
a light guide having a plurality of input terminals coupled to the plurality of light sources for receiving the illumination light beams from the respective light sources and a plurality of emission terminals coupled to the plurality of illumination optical systems for distributing the received illumination light beams among the plurality of illumination optical systems, each of the distributed illumination light beams being directed along a respective predetermined optical path,
wherein each of the plurality of illumination optical systems includes;
a variable optical filter disposed on the respective predetermined optical path of the distributed illumination light beam for controlling the intensity of the distributed illumination light beam, a transmissivity of the variable optical filter with respect to the distributed illumination light beam being continuously variable, and
an optical integrator receiving the distributed illumination light beam that has passed through the variable optical filter to form a plurality of images of the light source.

11. The illumination optical apparatus according to claim 10, wherein the number of the light sources is different from the number of the illumination optical systems.

12. The illumination optical apparatus according to claim 10, wherein the light guide mixes the illumination light beams received through the plurality of input terminals and substantially equally distributes the received illumination light beams among the plurality of illumination optical systems.

13. The illumination optical apparatus according to claim 10, wherein in each of the plurality of illumination optical systems, the optical integrator includes a plurality of optical elements disposed in a row at a first predetermined pitch along a first predetermined direction, the transmissivity of the variable optical filter varying monotonically in a direction substantially perpendicular to the first predetermined direction in which the plurality of optical elements are disposed with the first predetermined pitch, the transmissivity of the variable optical filter varying periodically at a second predetermined pitch in a direction corresponding to the first predetermined direction.

14. The illumination optical apparatus according to claim 13, wherein in each of the plurality of illumination optical systems, the optical integrator and the variable optical filter are adapted to satisfy the following equation, $$p_f = \frac{M}{\beta(M \cdot k + i)} P_0,$$

where $P_0$ represents the first predetermined pitch, $p_f$ represents the second predetermined pitch, M represents the number of the optical elements disposed in the first predetermined direction with pitch $P_0$, β represents an effective magnification between the variable optical filter and the optical integrator, k represents a non-negative integer, and i represents a positive integer smaller than M that cannot be factorized by any factor of M other than 1.

15. The illumination optical apparatus according to claim 10, wherein each of the plurality of illumination optical systems further includes a light intensity monitor for outputting signals indicating an intensity of light beams emerging from the optical integrator, and wherein the illumination optical apparatus further comprises a controller communicating with each of the light intensity monitor and controlling each of the variable optical filters in accordance with the respective signals indicating the intensity of the light beams from the respective optical integrator to adjust the intensity by feedback control.

16. The illumination optical apparatus according to claim 15, wherein the controller controls the variable optical filters to substantially equalize the intensity of the light beams from the optical integrator among the plurality of illumination optical systems.

17. The illumination optical apparatus according to claim 15, wherein in each of the plurality of illumination optical systems, the light intensity monitor includes:

a half mirror for extracting a portion of the light beams from the optical integrator; and a detector for detecting the intensity of the extracted portion of the light beams.

18. The illumination optical apparatus according to claim 15, wherein the controller includes:

a signal processor for processing signals from each of the light intensity monitor indicating the intensity of the light beams from the corresponding optical integrator to output control signals for controlling each of the variable optical filters; and a plurality of variable optical filter drivers for moving the respective variable optical filter in a direction substantially perpendicular to the predetermined optical path of the respective illumination light beam in accordance with the control signals from the signal processor to continuously change the transmissivity of the respective variable optical filter with respect to the respective illumination light beam.

19. An illumination optical apparatus, comprising:

a plurality of illumination optical systems, each including;

a light source emitting an illumination light beam, the illumination light beam being directed along a predetermined optical path, a variable optical filter disposed on the predetermined optical path of the illumination light beam for controlling an intensity of the illumination light beam, a transmissivity of the variable optical filter with respect to the illumination light beam being continuously variable, an optical integrator receiving the illumination light beam that has passed through the variable optical filter to form a plurality of images of the light source, and a light intensity monitor outputting signals indicating the intensity of light beams emerging from the optical integrator; and a controller communicating with each of the light intensity monitors and controlling each of the variable optical filters in accordance with the signals indicating the intensity of the respective light beams from the optical integrator to adjust the intensity by feedback control.

20. The illumination optical apparatus according to claim 19, wherein the controller controls the variable optical filters to substantially equalize the intensity of the light beams from the optical integrator among the plurality of illumination optical systems.

21. The illumination optical apparatus according to claim 19, wherein in each of the plurality of illumination optical systems, the light intensity monitor includes:

a half mirror for extracting a portion of the light beams from the optical integrator; and a detector for detecting the intensity of the extracted portion of the light beams.

22. The illumination optical apparatus according to claim 19, wherein the controller includes:

a signal processor for processing the signals from each of the light intensity monitor indicating the intensity of the light beams from the respective optical integrator to output control signals for controlling each of the variable optical filter; and a plurality of variable optical filter drivers for moving the respective variable optical filter in a direction substantially perpendicular to the predetermined optical path of the respective illumination light beam in accordance with the control signals from the signal processor to continuously change the transmissivity of the respective variable optical filter with respect to the respective illumination light beam.

23. An optical filter to be installed in an illumination optical system having a light source and an optical integrator for producing a plurality of images of the light source, the optical filter comprising:

a transparent plate; and a plurality of elongated wedge-shape light blocking patterns arranged substantially in parallel with each other along a predetermined direction on the transparent plate, each of the elongated wedge-shape light blocking patterns extending in a direction substantially perpendicular to the predetermined direction with a width thereof monotonically changing so that a transmissivity of the optical filter with respect to light from the light source can be continuously variable.

* * * * *